United States Patent
Larsson et al.

(10) Patent No.: US 8,184,412 B2
(45) Date of Patent: May 22, 2012

(54) ELECTRIC POWER CONVERTER

(75) Inventors: Tomas Larsson, Västerås (SE); Marcio Magalhães De Oliveira, Västerås (SE); Åke Petersson, Västerås (SE); Jean-Philippe Hasler, Västerås (SE)

(73) Assignee: ABB Technology Ltd, Zürich (CH)

( * ) Notice: Subject to any disclaimer, the term of this patent is extended or adjusted under 35 U.S.C. 154(b) by 653 days.

(21) Appl. No.: 11/887,576

(22) PCT Filed: Mar. 31, 2006

(86) PCT No.: PCT/SE2006/000396
§ 371 (c)(1),
(2), (4) Date: Jun. 8, 2009

(87) PCT Pub. No.: WO2006/104449
PCT Pub. Date: Oct. 5, 2006

(65) Prior Publication Data
US 2009/0284876 A1 Nov. 19, 2009

Related U.S. Application Data

(60) Provisional application No. 60/667,066, filed on Apr. 1, 2005.

(51) Int. Cl.
*H02H 3/08* (2006.01)

(52) U.S. Cl. .......................................... 361/18; 361/93.1

(58) Field of Classification Search .................... 361/18, 361/93.1, 93.7–93.9
See application file for complete search history.

(56) References Cited

U.S. PATENT DOCUMENTS

| | | | | |
|---|---|---|---|---|
| 5,008,797 A * | 4/1991 | Patel et al. | ....................... | 363/43 |
| 5,986,909 A | 11/1999 | Hammond et al. | | |
| 6,469,461 B1 * | 10/2002 | Konda et al. | ............. | 318/400.21 |

FOREIGN PATENT DOCUMENTS

WO WO-0011407 A2 3/2000

OTHER PUBLICATIONS

PCT/ISA/210—International Search Report—Jun. 21, 2006.
PCT/IPEA/409—International Preliminary Report on Patentability—Jun. 14, 2007.
PCT/ISA/237—Written Opinion of the International Searching Authority—Jun. 21, 2006.

* cited by examiner

*Primary Examiner* — Danny Nguyen
(74) *Attorney, Agent, or Firm* — Venable LLP; Eric J. Franklin

(57) ABSTRACT

A voltage source converter including a string of series connected active semiconducting elements. The converter includes in case of an active semiconducting element failure a calculation element configured to calculate an operation dc voltage including a sum of dc ratings of each remaining active semiconducting element in the string, and a regulator configured to regulate the converter to assume the operation dc voltage over the converter.

10 Claims, 3 Drawing Sheets

ELECTRIC POWER CONVERTER

CROSS-REFERENCE TO RELATED APPLICATIONS

This application claims priority to U.S. provisional patent application 60/667,066 filed 1 Apr. 2005 and is the national phase under 35 U.S.C. §371 of PCT/SE2006/000396 filed 31 Mar. 2006.

TECHNICAL FIELD

The present invention concerns an electric converter for high voltage applications comprising a plurality of series connected electric switches. Especially, the invention concerns a voltage source converter comprising extinguishable semiconducting means. In particular, the invention concerns a plurality of series connected semiconducting devices having a "short circuit failure mode".

By the expression short circuit failure should be understood that in case of failure of one of the series connected semiconducting elements the circuit is not open but kept closed. High voltage applications comprise distribution and transfer of electric power. Commonly the range for these applications is from 2 kV and upwards, and preferable from 5 kV and upwards.

BACKGROUND OF THE INVENTION

Common practice for designing a voltage source converter for high voltage applications involves series connected switches. Each switch has the function of opening and closing an electric circuit. For series connection the closing operation is vital since otherwise the whole valve will be an opening circuit and the valve could not operate. Hence if a switch experiences a malfunction it must be capable of achieving a short circuit failure mode. The switch normally comprises an extinguishable semiconductor element. However, most such semiconducting elements stay open in a failure mode. Hence, a converter comprising a plurality of series connected semiconducting element each semiconducting element must involve a short circuit failure mode. This may either be accomplished by a parallel circuit to the semiconducting element or by designing the semiconducting element to assume a short circuit in failure mode.

Each semiconducting element comprises an individual voltage rating for an allowable dc voltage stress across its main terminals. Hence, to design a voltage source converter for a specific total voltage rating a specific number of active semiconducting elements in series connection is demanded. If one of these semiconducting elements experiences a malfunction the whole converter trips and must be brought out of operation. To account for a semiconducting element failure it is known to arrange a plurality of redundant semiconducting elements in a string of series connected semiconducting elements. Thus the string of semiconducting elements comprises a specific number of active semiconducting elements, necessary for the operation, and a specific number of redundant semiconducting elements. When all of these redundant semiconducting elements have broken down the operation of the converter is accomplished by the still active semiconducting elements. But when one of the active semiconducting elements assumes a short circuit failure mode the converter trips and must be taken out of operation.

If thus a semiconductor failure occurs during operation, the converter remains in operation as long as the number of broken positions in one valve is less than the number of redundant positions. Depending on the system design and the converter voltage rating, several positions can be redundant. Should all redundant positions in one valve be broken and an additional position breaks down, the plant has to trip. This means that the plant will be out of operation until it has been repaired with a new set of semiconducting elements.

SUMMARY OF THE INVENTION

A primary object of the present invention is to seek ways to provide a converter that is capable of operation also with a failure of one of the active semiconducting devices.

This object is achieved according to the invention by an electric converter or by a method.

According to the invention the DC voltage of the converter is decreased when one of the active semiconducting elements has assumed a short circuit mode. This occurs when the number of broken positions exceeds the number of redundant positions. The decreased dc voltage is the sum of the individual voltage rating of the still active semiconducting elements in the string of series connected semiconducting elements. By decreasing the dc voltage of the converter it may still be in operation. The dc voltage may be regulated in steps or in ranges defined by the characters of the individual semiconducting elements.

Considering the voltage rating of the VSC, the DC voltage is the designing parameter. If all redundant semiconducting elements plus one active semiconducting element are broken, the DC voltage is decreased to allow the remaining components to stay within their voltage rating. The benefit is an increased availability of the VSC and converting forced outages to deferred or planned outages. However, the system impact is a reduction of the converter voltage rating. In a compensator for reactive power the performance in the capacitive region may be reduced depending on the VSC operating point. In the inductive region, the capability of reactive power absorption by the VSC is not reduced even after failure of all redundant semiconducting elements plus one or more active semiconducting element.

In a first aspect of the invention the object is achieved by a voltage source converter comprising a string of series connected active semiconducting elements, wherein the converter comprises, in case of an active semiconducting element failure, means for calculating an operation dc voltage comprising the sum of the dc ratings of each remaining active semiconducting element in the string, and means for regulating the converter to assume the operation dc voltage over the converter. In a further embodiment of the invention the individual voltage ratings are defined by a range. In a further embodiment the voltage rating of each individual semiconducting element is defined and stored in the control unit.

In a second aspect of the invention the objects are achieved by a method for compensating the failure of an active series connected semiconducting element in a string of a voltage source converter, comprising: detecting the failure of an active semiconducting element, calculating an operation dc voltage comprising the sum of the dc ratings of each remaining active semiconducting elements, regulating the total dc voltage over the converter to assume the operating voltage. In a further embodiment of this aspect the operation dc voltage calculation is made from voltage rating ranges of the remaining active semiconducting elements.

BRIEF DESCRIPTION OF THE DRAWINGS

Other features and advantages of the present invention will become more apparent to a person skilled in the art from the following detailed description in conjunction with the appended drawings in which.

DESCRIPTION OF PREFERRED EMBODIMENTS

Figure 1:
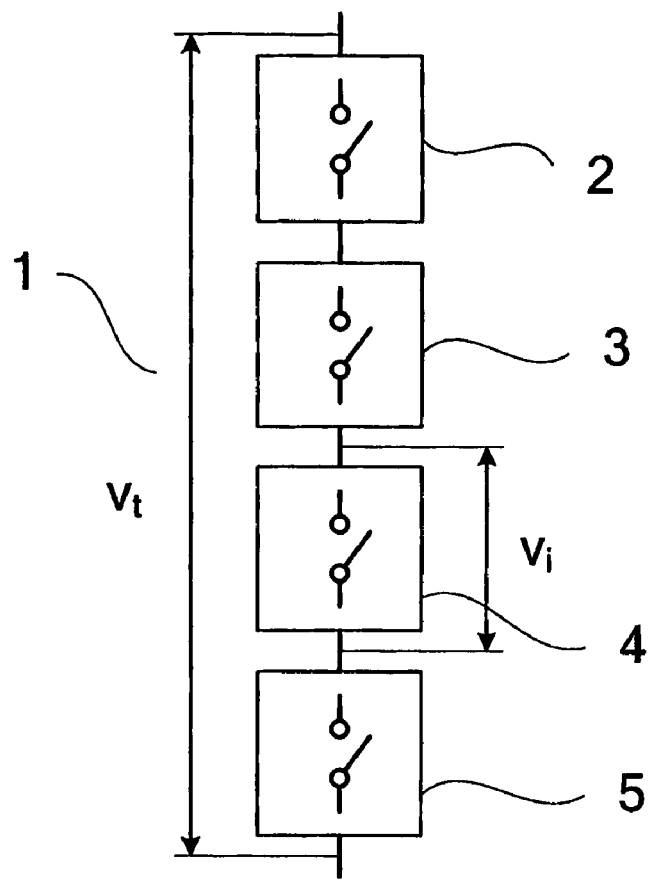
FIG. 1 is a principal circuit of a string of switches connected in series of an electrical converter.

A string 1 of series connected switches 2, 3, 4, 5 is shown in FIG. 1. Each individual switch is denoted a switch symbol in order to show the necessity of the switch being capable at all times to assume a closed circuit or an open circuit as demanded from a control unit. Especially when series connected, the capability to assume a closed circuit is vital for the function of the converter. It is known to arrange the switches with semiconducting extinguishable elements. These semiconducting elements must thus comprise a short circuit failure mode.

When designing a string of series connected semiconducting elements care must be taken to redundancy. From design criteria the converter must have a defined operation capability. From long time experience it is known that semiconducting element has certain ability to break down. Hence a converter valve must contain as many semiconducting elements in series connection as the total dc voltage over the valve divided with the internal dc voltage capacity of the individual semiconducting elements in the string. However designing from such a criteria would lead to that when one of the semiconducting elements breaks down the converter trips and cannot operate. In order to solve this problem a plurality of redundant semiconducting element is added in the string. Thus when a first redundant semiconducting element breaks down the remaining semiconducting elements is capable of separating the total dc voltage over the converter. When all redundant semiconducting elements have broken down the next semiconducting element to breakdown will put the converter out of operation.

In FIG. 1 only four semiconducting elements are shown for reasons of simplicity. For a voltage source converter in real operation the string may comprises 3 to 30 semiconducting elements. For high dc voltage operation in the upper region the converter may comprise 100-200 series connected elements. Each semiconducting element in FIG. 1 has an individual voltage rating $v_i$. The whole string has a total dc voltage capacity $v_t$. Assuming that the first semiconducting element 2 is a redundant semiconducting element the total dc voltage comprises the sum of the individual voltages of the remaining semiconducting elements 3, 4, 5. Then if one of the semiconducting elements breaks down, thus assuming a closed circuit, the remaining semiconducting elements are capable of handling the total voltage. However if also one of the remaining semiconducting elements breaks down the total dc voltage is greater than the sum of the remaining semiconducting elements and the converter trips.

Figure 2:
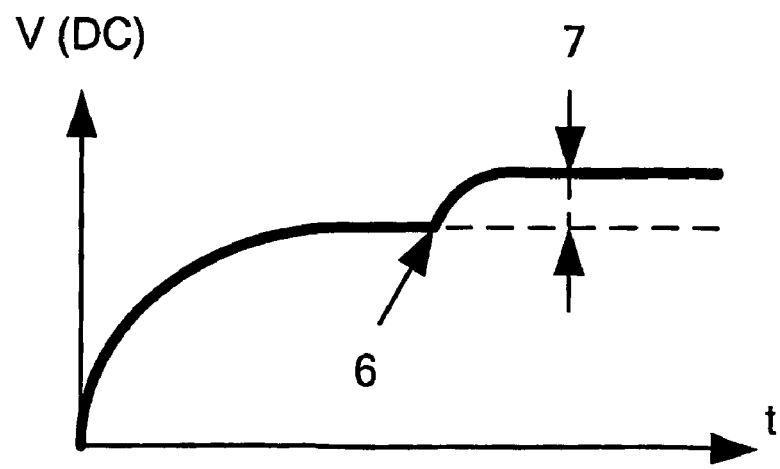
FIG. 2 is a diagram showing the possible regulation of a voltage source converter.

According to the invention the total dc voltage over the string is instead regulated to assume an operating dc voltage which is lower than the total voltage. The optimum operation dc voltage would be the sum of the voltages of the still operating elements. In FIG. 2 is shown the capability of regulating the operation dc voltage of a voltage source converter. In a first period of operation the dc voltage reaches a first dc voltage 7 when the converter is energized. In a second mode of operation the dc voltage is boosted to an operation dc voltage 8 to meet the demand of operation. This boosting capacity is used according to the invention for forming an operating dc voltage not tripping the converter when one or more of the active semiconducting elements are broken.

Figure 3:
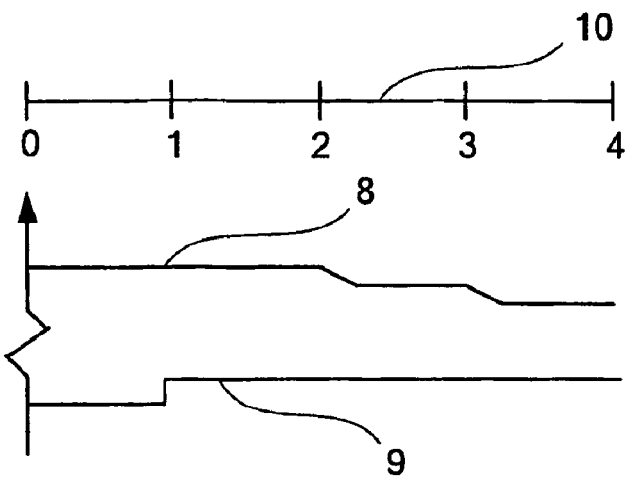
FIG. 3 is a diagram showing the principle of regulating the dc voltage according to the invention.

In an embodiment of the invention the operation dc voltage is regulated by way of example as in FIG. 3. The top line in the figure shows the number of failed positions 10. The first curve 8 is the total dc voltage over the converter. The second curve 9 is the dc voltage per element. It is assumed in FIG. 3 that the first failed position is a redundant element. Thus when the first position has failed the total dc voltage over the converter is the same but the dc voltage per semiconducting element is raised to its maximum voltage. Under this condition the converter continues to operate at full power. When the second position has failed the total dc voltage is decreased, thus resulting in the dc voltage per semiconducting element being maintained at a safe level. When also a third position fails the operation dc voltage of the converter is further decreased. This results in the safe dc voltage per semiconducting elements still being maintained. Hence by decreasing the operation dc voltage of the converter it may still be in operation with a lower capacity.

Figure 4:
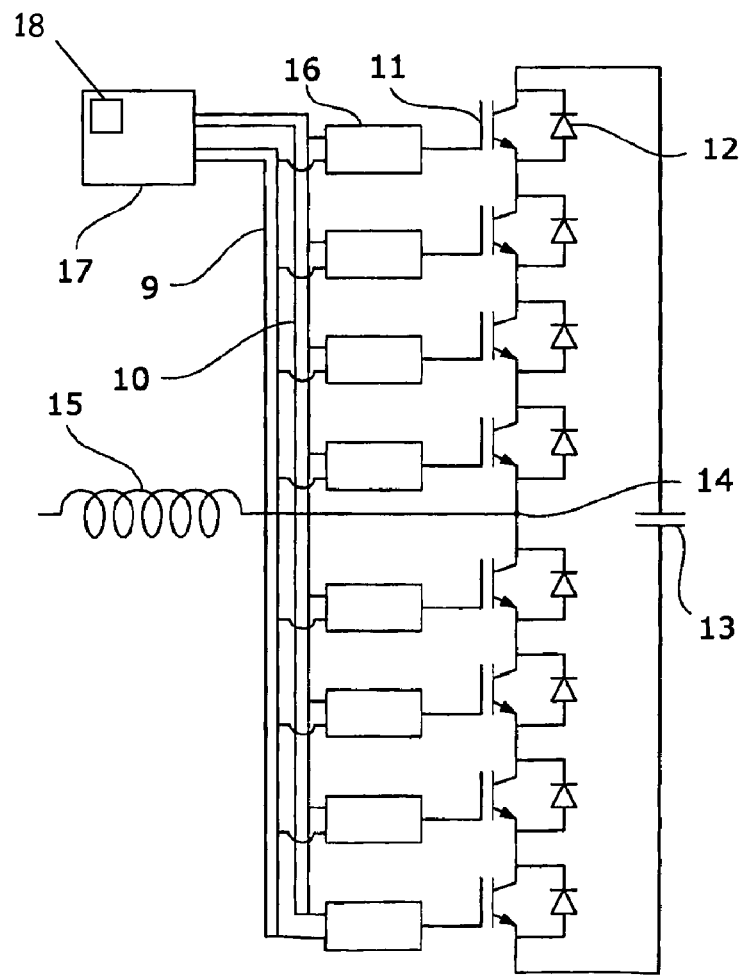
FIG. 4 is a principal circuit of a typical voltage source converter according to the invention.
Figure 5:
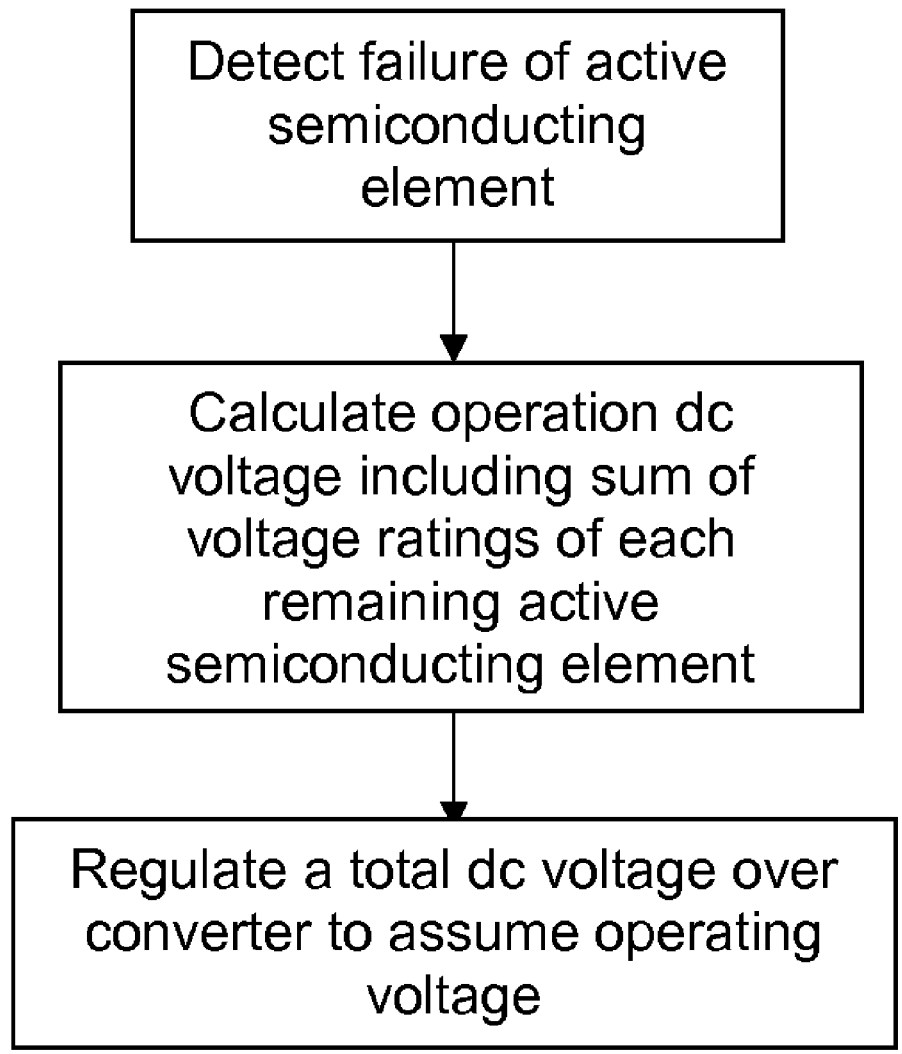
FIG. 5 is a flowchart showing an embodiment of a method according to the invention.

A phase leg of a high voltage converter circuit, to which the present invention is applicable, is schematically shown in FIG. 4. There are normally three phase legs having a DC capacitor 13 in common in a plant connected to a three-phase alternating current network. This comprises in a conventional way, a plurality of power semiconductor devices 11 connected in series, here in the form of IGBTs, and a so-called free-wheeling diode 12 connected in anti-parallel with each such device. The number of power semiconductor devices connected in series is, in practice, considerably higher than indicated in FIG. 4.

The series connection of power semiconductor devices is connected to a DC capacitor 13, while the phase terminal 14 between the power semiconductor devices is connected to a phase of an alternating voltage network. In the embodiment shown the connection to the network comprises a phase reactor 15. The power semiconductor devices with diodes arranged above the phase terminal 14 in FIG. 4 form an IGBT valve and those located thereunder form another IGBT valve.

All power semiconductor devices in the IGBT valve are turned on simultaneously through signals from a drive unit 16, each schematically indicated, so that the power semiconductor devices in the first IGBT valve are conducting when a positive potential is desired at the phase terminal 14 and the power semiconductor devices in the second IGBT valve are conducting when a negative potential is desired on the phase terminal 14.

By controlling the power semiconductor devices according to a determined pulse width modulation pattern (PWM), the direct voltage across the DC capacitor 13 may be used for generating a voltage at the phase terminal 14, the fundamental component of which is an alternating voltage having a desired amplitude, frequency and phase position. Such controlling takes place by sending control pulses to the different drive units from a control unit 17, which normally takes place through fiber optics. In the example of FIG. 4 there are a first optical fiber 9 and a second optical fiber 10. The first optical fiber is used for sending a switching order and the second optical fiber is used for receiving status information from the semiconducting elements.

The information exchange between the control unit 17 and a drive unit 16 is bi-direction communication via an optical fiber. The switching order is sent from control unit 17 to drive unit 16. The Indication signal of the switching event may be sent back from drive unit 16 to control unit 17. The control unit is located on a low voltage potential, and galvanically separated from the drive units 16, which is located on a high voltage potential. The indication signal of a switching event is generated in the drive control unit. The control unit comprises computer means 18 and memory means for calculation and controlling the signals to the drive units.

Although favorable the scope of the invention must not be limited by the embodiments presented but contain also embodiments obvious to a person skilled in the art. For instance a safe dc level for each individual semiconducting element may be defined and stored in the control system. In a further embodiment a safe dc voltage level range may be defined for each semiconducting element.

The invention claimed is:

1. A voltage source converter, comprising:
   a string of series connected active semiconducting elements,
   a control unit configured to calculate an operation dc voltage comprising a sum of voltage ratings of each remaining active semiconducting element in the string in case of an active semiconducting element failure, and configured to regulate the converter to assume the operation dc voltage over the converter.

2. The voltage source converter according to claim 1, wherein the voltage ratings of each remaining active semiconducting element is defined with a dc voltage level range.

3. The voltage source converter according to claim 1, wherein the voltage rating comprises a voltage range of each individual semiconducting element.

4. A method for compensating for a failure of an active series connected semiconducting element in a string of a voltage source converter, the method comprising:
   detecting the failure of the active semiconducting element,
   calculating an operation dc voltage comprising a sum of voltage ratings of each remaining active semiconducting element, and
   regulating a total dc voltage over the converter to assume the operating voltage.

5. The method according to claim 4, wherein the operation dc voltage is calculated from ranges of individual semiconducting element voltage ratings.

6. The method according to claim 4, wherein the regulating comprises a stepwise regulation from a first dc voltage level to a second dc voltage level.

7. The method according to claim 4, wherein the regulating operation comprises a smooth regulation from a first dc voltage level to a second dc voltage level.

8. A computer program product, comprising:
   a non-transitory computer readable medium; and
   computer program instructions recorded on the computer readable medium and executable by a computer for carrying out a method comprising detecting failure of a active semiconducting element of a string of semiconducting elements, calculating an operation dc voltage comprising a sum of voltage ratings of each remaining active semiconducting element, and regulating a total dc voltage over a converter to assume the operating voltage.

9. The computer program product according to claim 8, wherein the computer program instructions are further for at least partially providing the computer program instructions at least in part over a network.

10. The computer program product according to claim 8, wherein the computer program instructions are further for at least partially providing the computer program instructions at least in part over the internet.

* * * * *